US005796268A

United States Patent [19]
Kaplinsky

[11] Patent Number: 5,796,268
[45] Date of Patent: Aug. 18, 1998

[54] PROGRAMMABLE LOGIC DEVICE WITH PARTIAL SWITCH MATRIX AND BYPASS MECHANISM

[76] Inventor: Cecil H. Kaplinsky, 140 Melville Ave., Palo Alto, Calif. 94301

[21] Appl. No.: 723,615

[22] Filed: Oct. 2, 1996

[51] Int. Cl.$^6$ ........................................... H03K 19/177
[52] U.S. Cl. ........................................... 326/39; 326/41
[58] Field of Search ................................. 326/38–41

[56] References Cited

U.S. PATENT DOCUMENTS

| | | | |
|---|---|---|---|
| 4,764,887 | 8/1988 | Lai et al. | 364/787 |
| 4,873,459 | 10/1989 | El Gamal et al. | 307/465 |
| 5,260,610 | 11/1993 | Pedersen et al. | 307/465 |
| 5,274,581 | 12/1993 | Cliff et al. | 364/784 |
| 5,550,782 | 8/1996 | Cliff et al. | 365/230.03 |
| 5,572,198 | 11/1996 | Sturges | 326/41 X |
| 5,614,840 | 3/1997 | McClintock et al. | 326/39 X |
| 5,644,496 | 7/1997 | Agrawal et al. | 326/39 X |

*Primary Examiner*—Jon Santamauro
*Attorney, Agent, or Firm*—Thomas Schneck; George B. F. Yee; John P. McGuire, Jr.

[57] ABSTRACT

A programmable logic device in accordance with the present invention includes a partially populated switch matrix for coupling a plurality of logic blocks. Having a partial switch matrix reduces the silicon area requirement of the device. In addition, the capacitive loading is reduced, which improves propagation speed and lowers the power requirement of the sense amps, since smaller sense amps can be used. Bypass means are provided to allow the propagation bit lines (i.e. carry and shift lines) to bypass one or more logic block. Each of the logic blocks includes a plurality of logic cells. Means are provided among the logic cells to provide bypass capability for the propagation lines among the logic cells. The logic cells feature means for reverse propagation of the carry and shift bits among the logic cells. The logic cells of the present invention also feature reverse propagation with bypass.

28 Claims, 14 Drawing Sheets

FIG. 3A

|  | Block1 | | | Block2 | | | Block3 | | | Block4 | | |
|---|---|---|---|---|---|---|---|---|---|---|---|---|
|  | Output1 | Output2 | Output3 | Output1 | Output2 | Output3 | Output1 | Output2 | Output3 | Output1 | Output2 | Output3 |
| Block1 | | | | | | | | | | | | |
| Input1 | S | | | | | | | | | | | |
| Input2 | | S | | | | | | | | | | |
| Input3 | | | S | | | | | | | | | |
| Input4 | | | | S | | | | | | S | | |
| Input5 | | | | | S | | | | | | S | |
| Input6 | | | | | | S | | | | | | S |
| Block2 | | | | | | | | | | | | |
| Input1 | S | | | | | | | | | | | |
| Input2 | | S | | | | | | | | | | |
| Input3 | | | S | | | | | | | | | |
| Input4 | | | | S | | | S | | | | | |
| Input5 | | | | | S | | | S | | | | |
| Input6 | | | | | | S | | | S | | | |
| Block3 | | | | | | | | | | | | |
| Input1 | S | | | | | | | | | | | |
| Input2 | | S | | | | | | | | | | |
| Input3 | | | S | | | | | | | | | |
| Input4 | | | | S | | | | | | S | | |
| Input5 | | | | | S | | | | | | S | |
| Input6 | | | | | | S | | | | | | S |
| Block4 | | | | | | | | | | | | |
| Input1 | S | | | | | | | | | | | |
| Input2 | | S | | | | | | | | | | |
| Input3 | | | S | | | | | | | | | |
| Input4 | | | | S | | | S | | | | | |
| Input5 | | | | | S | | | S | | | | |
| Input6 | | | | | | S | | | S | | | |

FIG. 3B

|  | Block1 | | | Block2 | | | Block3 | | | Block4 | | |
|---|---|---|---|---|---|---|---|---|---|---|---|---|
|  | Output1 | Output2 | Output3 | Output1 | Output2 | Output3 | Output1 | Output2 | Output3 | Output1 | Output2 | Output3 |
| Block1 | | | | | | | | | | | | |
| Input1 | S | | | | | | | | | | | |
| Input2 | | S | | S | | | | | | | | |
| Input3 | | | S | | S | | S | | | | | |
| Input4 | S | | | | | S | | S | | S | | |
| Input5 | | S | | S | | | | | S | | S | |
| Input6 | | | S | | S | | S | | | | | S |
| Block2 | | | | | | | | | | | | |
| Input1 | S | | | S | | | | | | | | |
| Input2 | | S | | | S | | S | | | | | |
| Input3 | S | | | | | S | | S | | S | | |
| Input4 | | S | | S | | | | | S | | S | |
| Input5 | S | | | | S | | S | | | | | S |
| Input6 | | S | | | | S | | S | | S | | |
| Block3 | | | | | | | | | | | | |
| Input1 | S | | | S | | | S | | | | | |
| Input2 | | S | | | S | | | S | | S | | |
| Input3 | S | | | | | S | | | S | | S | |
| Input4 | | S | | S | | | S | | | | | S |
| Input5 | S | | | | S | | | S | | S | | |
| Input6 | | S | | | | S | | | S | | S | |
| Block4 | | | | | | | | | | | | |
| Input1 | S | | | S | | | | S | | S | | |
| Input2 | | S | | | S | | S | | | | S | |
| Input3 | S | | | | | S | | S | | | | S |
| Input4 | | S | | S | | | S | | | S | | |
| Input5 | S | | | | S | | | | S | | S | |
| Input6 | | | S | | | S | | | S | | | S |

PROGRAMMABLE LOGIC DEVICE WITH PARTIAL SWITCH MATRIX AND BYPASS MECHANISM

TECHNICAL FIELD

The present invention relates generally to programmable logic devices and more specifically to a connection scheme for interconnecting the logic elements comprising a programmable logic device.

BACKGROUND ART

In the early days of integrated circuit technology, logic circuits, such as shift registers, multiplexers, adders and so on, were constructed from digital IC's. These small scale integration (SSI) IC's usually contained a small number (e.g. four–eight) of logic gates, including AND gates, OR gates, flip-flops, latches and such, which were composed of a few dozen or so transistors. As the technology advanced, increasing numbers of transistors could be incorporated into an IC. Today, semiconductor manufacturers are able to fit millions of transistors onto a single die, resulting in highly sophisticated chips such as the modern microprocessor.

Equally sophisticated are the systems into which these VLSI (very large scale integration) and ULSI (ultra-large scale integration) chips are incorporated. Such systems usually employ a number of custom logic chips to provide a variety of supporting logic functions. Gate arrays were developed, allowing manufacturers to quickly implement a customer's logic design. These devices consisted of an array of logic gates manufactured using standard methods. Customization of the devices took place during the final steps of manufacture, wherein a metallization layer connected the logic gates to implement the desired logic function.

A class of customizable IC's is the programmable logic device (PLD). PLD's are ideal for customers who make frequent design changes, or whose design has not yet been fully tested. A PLD contains a plurality of pass transistors which can be turned on or turned off to connect (or not connect) corresponding lines to logic gates, to other lines, or to output pins. By turning on the proper combination of pass transistors and connecting the proper set of lines, a user can obtain a desired logic function. The user can implement a different design in the chip simply by turning on and turning off a different combination of the pass transistors.

Modern PLD's include an array of functional units having inputs and outputs. Each functional unit is configurable to provide any one of a number of logical functions. A switch matrix provides connections between the inputs of the functional units and their outputs. The switch matrix typically provides complete interconnectivity between each input line and each output line. In this way, the PLD can realize every conceivable logic function of its inputs, including both combinatorial and sequential logic functions.

Referring to FIG. 1, a portion of a typical prior art PLD includes a plurality of functional units (logic blocks). FIG. 1 shows three such logic blocks, i, i+1, and i+2. Each logic block includes a set of inputs I and a set of outputs O. A switch matrix SM provides interconnectivity among the inputs I and outputs O. Specifically, each of the inputs is coupled to a first set of leads L1 of the switch matrix and each of the outputs is coupled to a second set of leads L2. A programmable interconnect (shown schematically as a diagonal line in FIG. 1) is disposed at each of the crosspoints between leads L1 and L2. By activating an interconnect to form a connection, the output out of any logic block can become the input into any logic block.

The logic blocks in FIG. 1 also include propagation-bit lines, namely carry-bit and shift-bit lines. Logic block i is referred to as being "sequentially adjacent" to logic block i+1, which is to say that an outgoing propagation-bit line ($C_o$, $S_o$) of logic block i becomes the incoming propagation-bit line ($C_i$, $S_i$) of a subsequent block i+1. Similarly, logic block i+1 is sequentially adjacent to logic block i+2, and so on.

The programmable interconnects which comprise the switch matrix SM in FIG. 1 usually are implemented using anti-fuse links, RAM devices, EPROM devices, and the like. Modern devices typically employ RAM or other equivalent pass transistor devices in the switch matrix. In a device having N functional units, P inputs, and R outputs per functional unit, a fully populated switch matrix requires ($N^2 * P * R$) programmable interconnects in order to provide complete interconnectivity among the functional units. This number becomes significant in typical devices containing hundreds of functional units, requiring a switch matrix having on the order of hundreds of thousands of programmable interconnects.

It is evident that the switch matrix in a PLD therefore consumes most of the silicon real estate. More significantly, the high number of transistor-based programmable interconnects creates a large capacitive load which degrades the propagation time. In addition, the switch matrix consumes most of the power supplied to the device since large power consuming sense amplifiers are needed for operation with such large numbers of interconnects.

It is a goal of this invention to provide a PLD having a switch matrix with a reduced silicon area, and one with a lower power consumption. It is desirable that the PLD of the present invention maintains the level of configurability and flexibility offered by conventional PLD's having a fully populated switch matrix.

SUMMARY OF THE INVENTION

A programmable logic device (PLD) of the present invention includes a switch matrix that is partially populated. With such a switch, the number of programmable interconnects between the input and output lines of the PLD is less than the number of possible intersections between the input and the output lines. Consequently, the size of the switch matrix is reduced and the power consumption, likewise, is reduced because of the smaller sense amps which can now be used.

In one embodiment, each output line has a programmable switch coupled to at most one input line of each functional unit (logic block) in the PLD. In this way, the number of programmable interconnects can be reduced from ($N^2 * P * R$) to ($N^2 * R$), where N is the number of logic blocks in the PLD, and P and R are the number of input lines and output lines respectively for each logic block.

By having fewer interconnects than there are intersections, complete interconnectivity is sacrificed to some degree. However, it is believed that better than 90% of logic functions encountered in typical PLD applications can be satisfied by the device of the present invention. Thus, savings in both silicon area of the device and power consumption are realized, while at the same time providing the logic functions needed by most systems designers.

In another embodiment of the invention, additional design flexibility is achieved by providing circuitry which allow a carry bit and/or shift bit to bypass a logic block and propagate to another logic block. In a partially (sparsely) populated switch matrix, there is the likelihood that a given logic block will not be accessible to other logic blocks, due to the limited number of available interconnects. The bypass circuitry of the present invention allows the propagation bits, such as the carry bit and the shift bit, to bypass a blocked logic block and to proceed to an available logic block.

In yet another embodiment of the present invention, each logic block consists of two or more logic cells, each logic cell providing an output of the logic block. As with the logic blocks, there is the possibility that some of the logic cells within a given logic block will be inaccessible to other logic blocks. Therefore, each logic cell also includes bypass circuitry, similar to the logic blocks, allowing the propagation bits to bypass certain logic cells within a logic block.

In another embodiment of the invention, further flexibility is achieved with respect to a carry chain and/or a shift chain among the logic cells within a logic block. Direction control circuitry is provided within each logic cell, allowing either the carry chain or the shift chain to propagate in a forward direction and a reverse direction. Thus, for shift registers, the shifting of bits can be reversed. For adders, the ordering of the most and the least significant bits of the data can be reversed. In a variation of this embodiment, reverse bypass circuitry is included in each logic cell to allow bypassing in the reverse direction.

BRIEF DESCRIPTION OF THE DRAWINGS

FIGS. 3A and 3B illustrate various configurations of a partially populated switch matrix.

BEST MODE OF CARRYING OUT THE INVENTION

Figure 1:
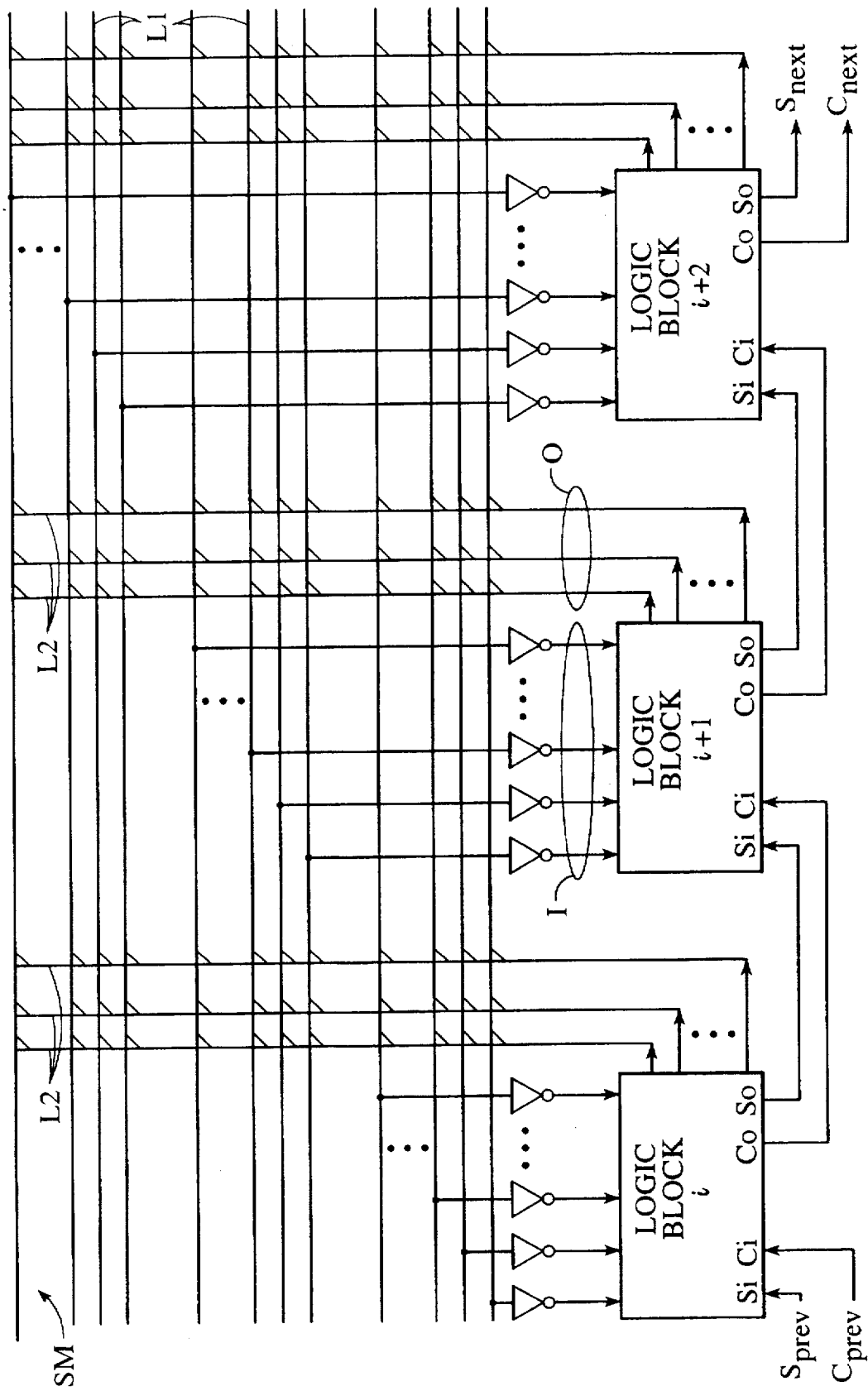
FIG. 1 shows the schematic layout of a typical prior art logic device.
Figure 2:
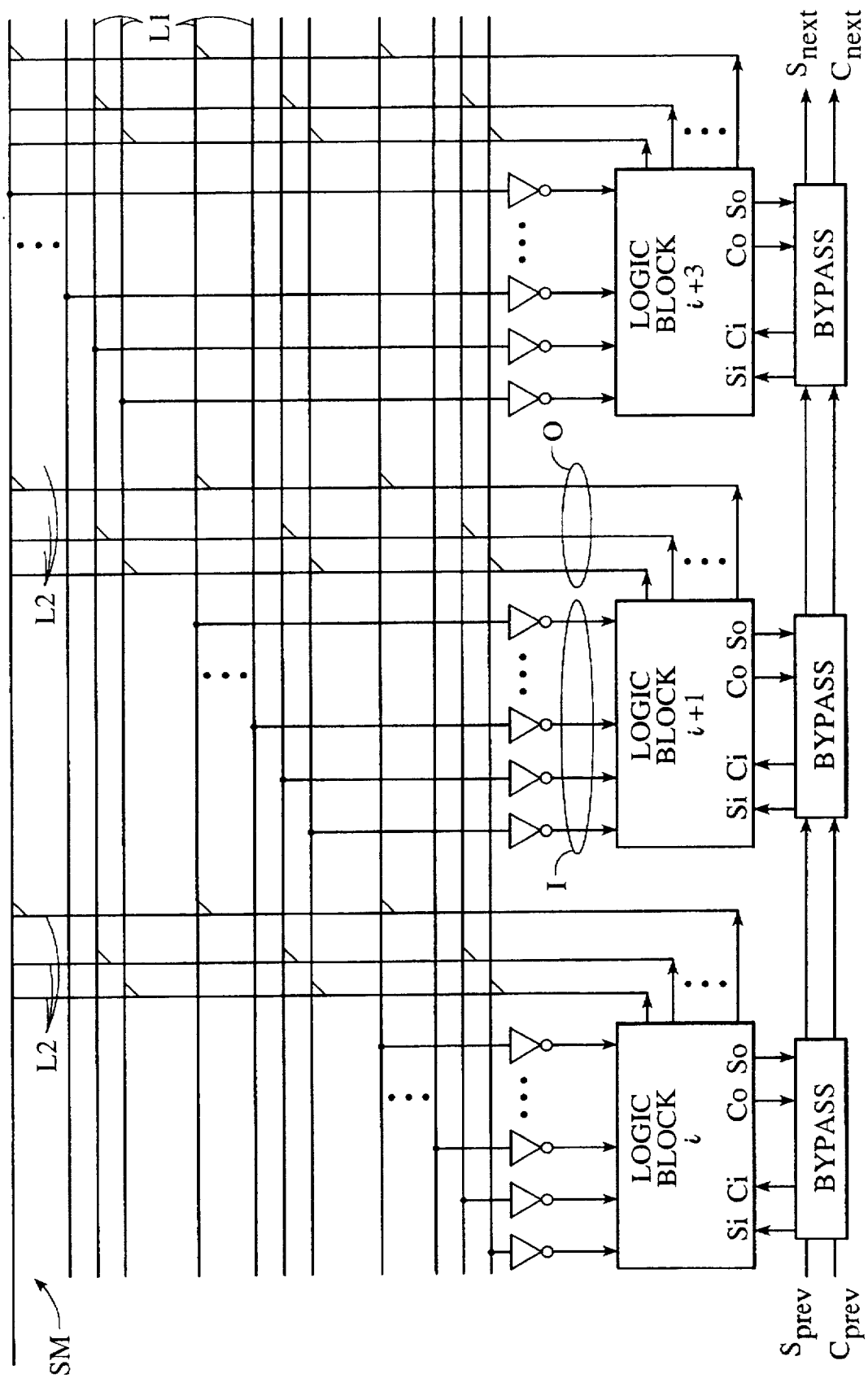
FIG. 2 shows the schematic layout of a logic device of the present invention.

Referring to FIG. 2, a programmable logic device (PLD) of the present invention includes a plurality of logic blocks, each having a plurality of inputs I and a plurality of outputs O. A switch matrix SM provides interconnectivity among the inputs and the outputs. However, the switch matrix of the present invention is partially populated. This is more clearly shown in FIG. 2 wherein each output 0 is coupled at most only to a subset of the inputs I. In particular, in the embodiment shown in FIG. 2, a first output of each logic block has programmable interconnects to a first input of each logic block. A second output of each logic block has programmable interconnects to a second input of each logic block, and so on. Consequently, there are fewer programmable interconnects than intersections between inputs and outputs.

The pattern of interconnects in the switch matrix illustrated in FIG. 2, however, is not the only pattern. Clearly, any pattern of interconnects in the switch matrix is contemplated, so long as the resulting matrix is partially populated. For example, FIGS. 3A and 3B show, in tabularized form, alternate patterns for a four logic block PLD, each block having six inputs and three outputs. The inputs to each of the four logic blocks are shown on the left side of the table, and the outputs of each of the blocks are shown along the top of the table. The presence of a programmable interconnect (switch) is shown by the letter 'S' within the table.

FIG. 3A shows a switch matrix in which the three outputs of alternating logic blocks (i.e. blocks 1 and 3) are programmably coupled respectively to the first three inputs of every logic block (i.e. blocks 1–4); and the three outputs of the other alternating logic blocks (i.e. blocks 2 and 4) are coupled to the last three inputs of every logic block (i.e. blocks 1–4). Similarly, FIG. 3B shows an interconnect pattern wherein the first output of each logic block has a programmable interconnect to the first and fourth inputs of each block, the second outputs have interconnects with the second and fifth inputs, and the third outputs have interconnects with the third and sixth inputs.

FIGS. 3A and 3B show that each of the outputs (Output1–Output3 of Block1–Block3) has programmable interconnects to exactly N of all of the inputs (Input1–Input6 of Block1–Block4), where N is 4 in FIG. 3A and N is 8 in FIG. 3B. Alternatively, each output could have programmable interconnects to at most N inputs, or to at least N inputs. These alternate embodiments emphasize the fact that each output could have a different number of programmable interconnects to the inputs; each output need not have the same number of programmable interconnects. In each embodiment, the number of programmable interconnects in the switch matrix is less than the number in a fully populated switch matrix. The differences among these embodiments are the degree of connectivity that is available to the user. Having a variety of differently populated switch matrices gives a logic designer flexibility in choosing between available device connectivity and device performance (i.e. capacitive loading and power requirements).

Figure 4:
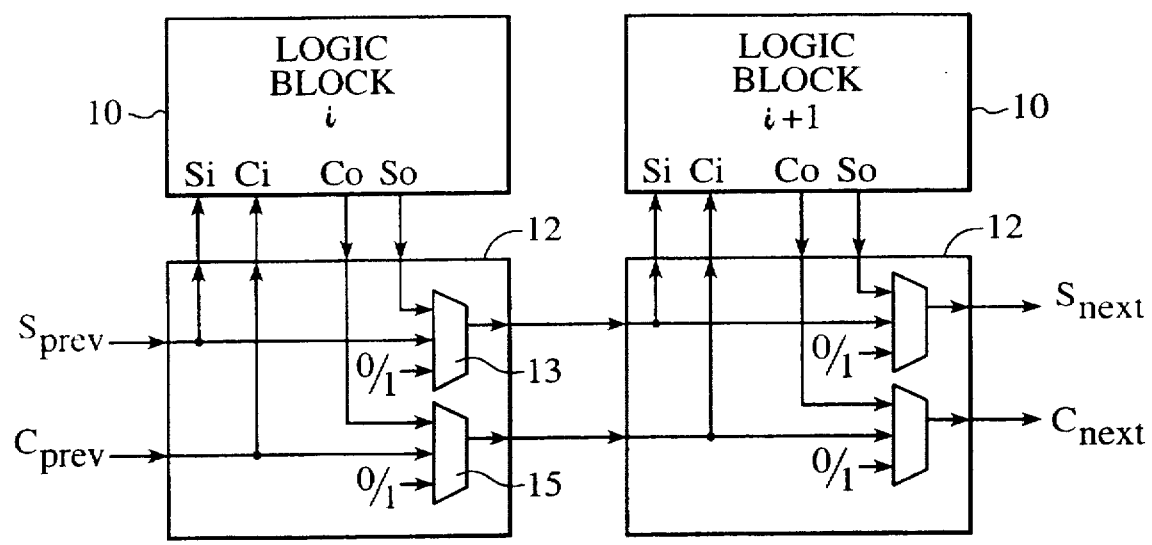
FIG. 4 depicts a logic block bypass circuit of the present invention.

Returning to FIG. 2, the PLD of the present invention includes a programmable bypass circuit associated with each logic block. Propagation bits, such as a carry bit or a shift bit, from the bypass circuit of a first logic block, say logic block i, enter the bypass circuit of its sequentially adjacent block, namely logic block i+1. Turning to FIG. 4, a preferred embodiment of block-level bypass circuit 12 includes a pair of 2:1 multiplexers 13 (15). An incoming propagation bit $S_{prev}$ ($C_{prev}$) tees off; one leg of the tee being coupled to a propagation bit input $S_i$ ($C_i$) of the logic block 10; the other leg of the tee being coupled to an input of the multiplexer 13 (15). A propagation bit output $S_o$ ($C_o$) of the logic block 10 is fed into the other input of the multiplexer 13 (15). The output of the multiplexer serves as the incoming propagation bit of the bypass circuit 12' of the sequentially adjacent logic block 10'.

In a non-bypassed mode, the incoming propagation bit $S_{prev}$ ($C_{prev}$) feeds into the logic block 10 and the multiplexer 13 (15) is selected to transfer the propagation bit output $S_o$ ($C_o$) of the logic block 10 to the multiplexer output. In a bypassed mode, the multiplexer is selected to produce the incoming propagation bit $S_{prev}$ ($C_{prev}$) at its output, which then feeds into the subsequent logic block 10', thus bypassing logic block 10. Note that when a logic block is bypassed, the propagation bits are still fed into the inputs $S_i$ ($C_i$) of the bypassed logic block. Presumably, the bypassed logic block is configured in such a way that it ignores the propagation bits. Alternatively, it may be desirable in some applications to sense the passing of a propagation bit and to act accordingly.

In one variation of the block-level bypass circuits of FIG. 4, the multiplexers 13, 15 have a third input to which a programmable element is coupled. The programmable element, shown as "0/1", produces either a logic zero or a logic one as needed. Thus, for example, the programmable element for the shift bit can be set to produce a logic one in order to initiate a shift chain with a one bit.

Figure 5:
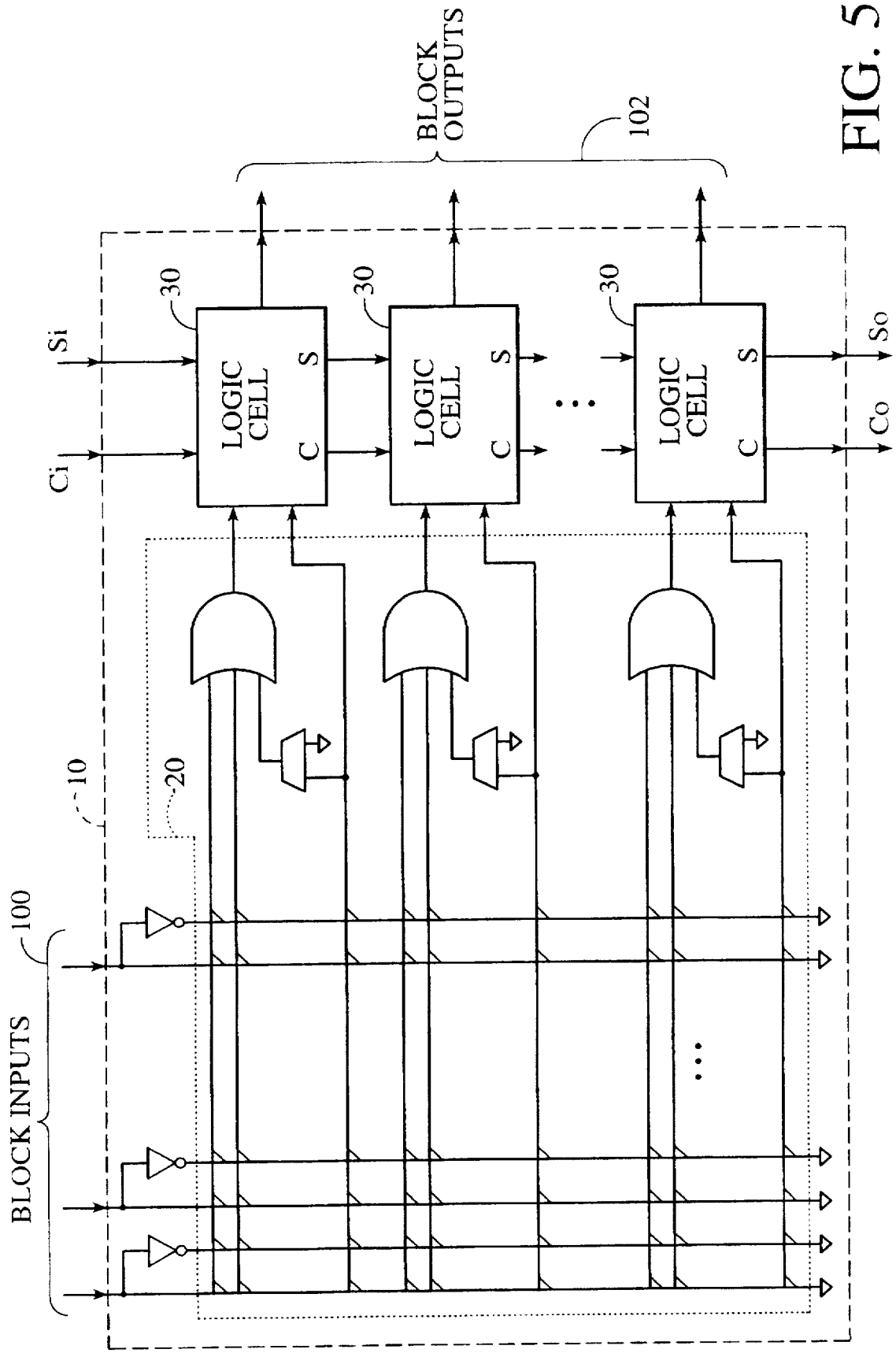
FIG. 5 shows the internal structure of logic block.

The discussion will now focus on the internal structure of the logic blocks of the present invention. FIG. 5 shows a logic block 10 having block inputs and block outputs. The logic block 10 includes a plurality of logic cells 30, the output 102 of each cell comprising the block outputs. A programmable input means 20 provides inputs 100 to the logic cells as functions of the block inputs. Although the cells depicted in FIG. 5 have two inputs, this is not critical. Other configurations of logic cells 30 having more than two inputs will work equally well in the present invention.

Similarly, the programmable input means 20 shown in FIG. 5 is exemplary only and is not intended to represent a preferred embodiment. The invention works equally well with other configurations of input means 20. The input means of FIG. 5 consists of a programmable AND array feeding into a fixed OR array, typically referred to as a "programmable array logic" configuration. Alternatively, the input means may consist of a programmable OR array feeding into a fixed AND array, known as a "programmable logic element" configuration. Yet another configuration is a "programmable logic array" consisting of both a programmable AND array and a programmable OR array.

The logic cells 30 further include inputs and outputs for carry and shift bits. An incoming propagation bit $C_i$ ($S_i$) feeding into the logic block 10 is received by a first logic cell. The propagation bit proceeds through successive logic cells within the logic block and feeds out of the logic block as outgoing propagation bits $C_o$ ($S_o$). Thus, except for the first and last logic cell in the logic block 10, each logic cell 30 can receive carry and shift bits from a preceding logic cell and can transmit carry and shift bits to a succeeding logic cell. With respect to the present invention, the preceding logic cell is said to be "sequentially adjacent" to the succeeding logic cell. The idea of sequential adjacency between cells will be discussed further below.

Figure 6A:
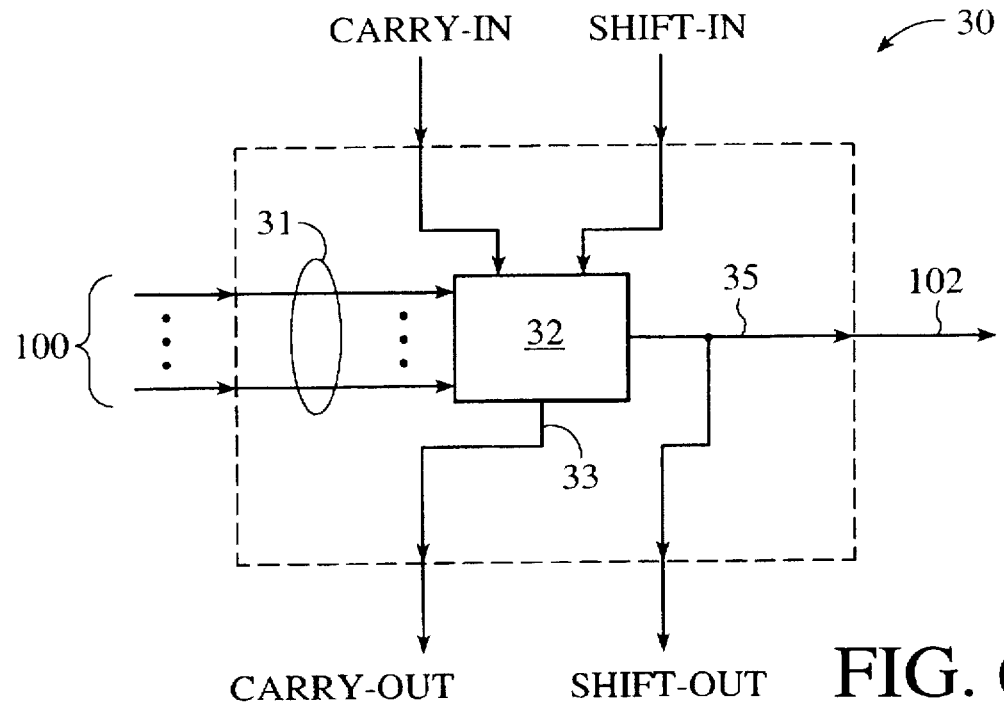
FIGS. 6A and 6B show the internal structure of a logic cell.
Figure 6B:
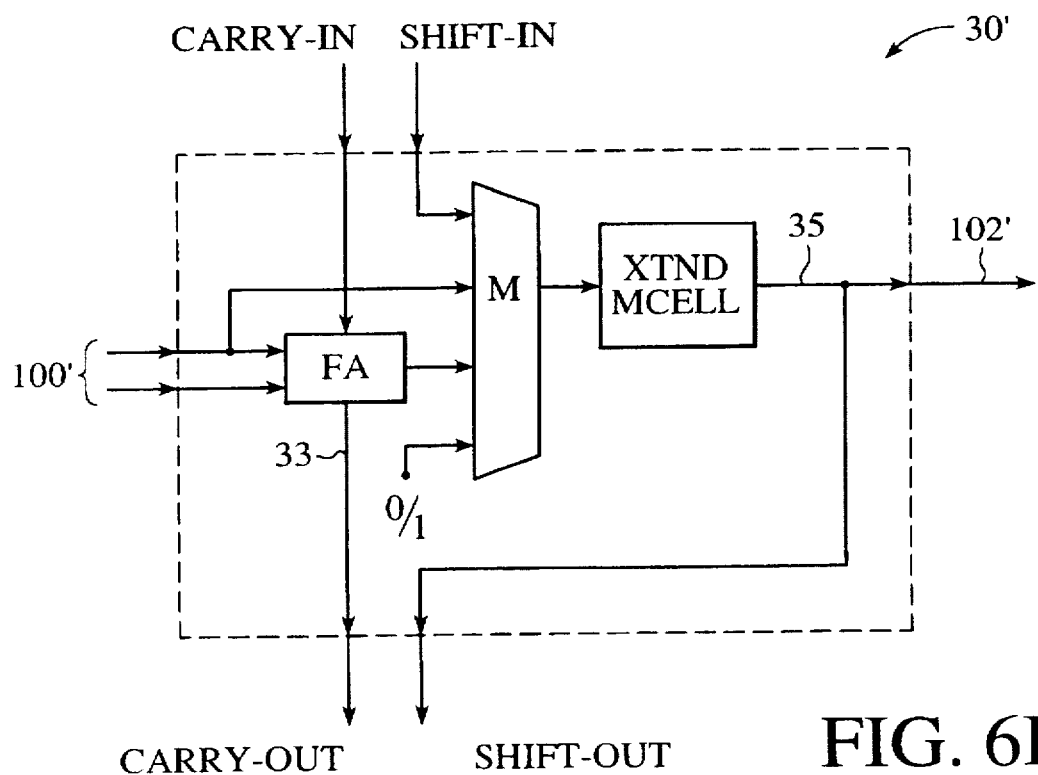

In FIG. 6A, a generic prior art logic cell 30 includes programmable logic circuitry 32 for providing any one of a number of logic functions. Carry-in and shift-in bit lines feed into the logic circuitry 32. A carry bit 33, which may be generated when the logic circuitry is configured as an adder or a subtracter, is fed to a carry-out bit line of the logic cell 30. The output 102 of the logic cell is provided by logic circuitry output 35. In addition, the logic circuitry output 35 serves as the shift-out bit line of the logic cell. Referring to FIG. 6B a typical implementation of the prior art logic cell 30' includes a full adder coupled to an extended macrocell XTND MCELL through a multiplexer M. The incoming shift-in bit line also is coupled to the extended macrocell through the multiplexer. The macrocell can provide certain programmable logic functions; see for example, U.S. Pat. No. 5,424,654 owned by the owner of the present invention.

Figure 7A:
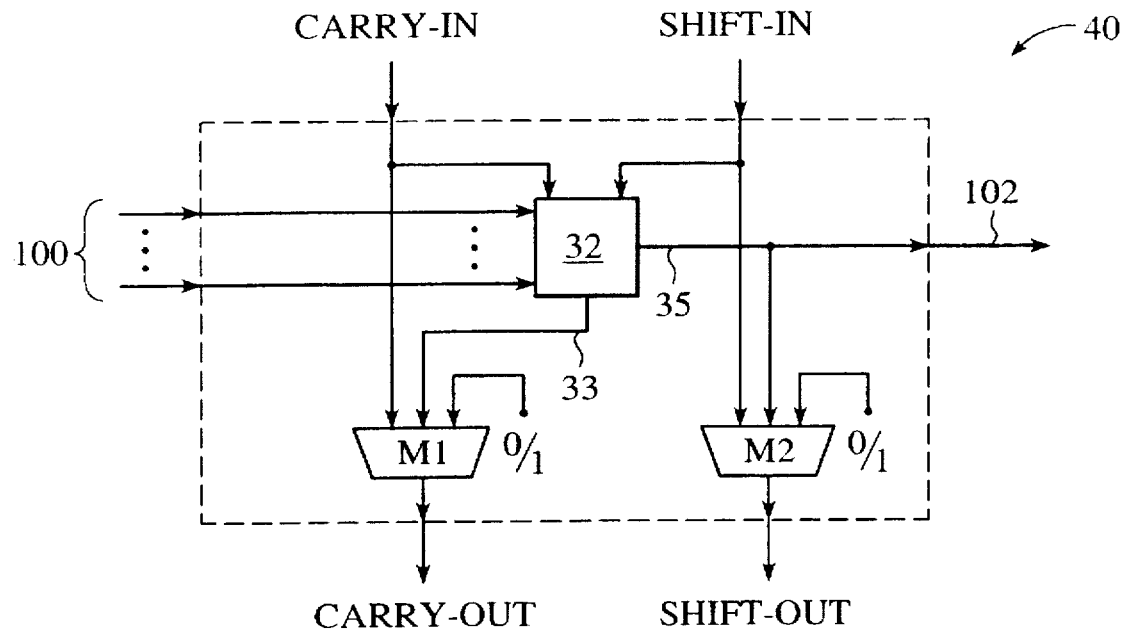
FIGS. 7A and 7B show a bypass means within a logic cell.

Turn now to FIG. 7A for a discussion of a logic cell in accordance with the present invention. The logic cell 40 includes a pair of multiplexers M1, M2, in addition to the conventional logic circuitry 32 such as shown by the example in FIG. 6B. The carry-in bit line of the logic cell feeds into the circuitry 32 and into a first input of the mux M1. The carry bit 33 generated by the circuitry 32 is fed to a second input of the mux. The mux output is coupled to the carry-out bit line of the logic cell 40. Selecting the first mux input transfers the carry-in bit line of the logic cell 40 to its carry-out bit line, thereby effecting a bypass of the logic cell. Selecting the second mux input transfers the carry bit 33 to the carry-out bit line, resulting in the usual forward propagation of the carry bit.

The multiplexer M2 is connected in a similar manner for the shift-in and shift-out bit lines. The shift-in bit line of the logic cell 40 is coupled to a first input of mux M2, while the output 35 of the logic circuitry 32 is coupled to a second input of the mux. The mux output is coupled to the shift-out bit line. Selecting the first mux input transfers the shift-in bit line to the shift-out bit line, thereby effecting a bypass of the logic cell. Alternatively, selecting the second mux input transfers the logic output 35 of the logic cell, resulting in a forward propagation of the shift bit.

Figure 7B:
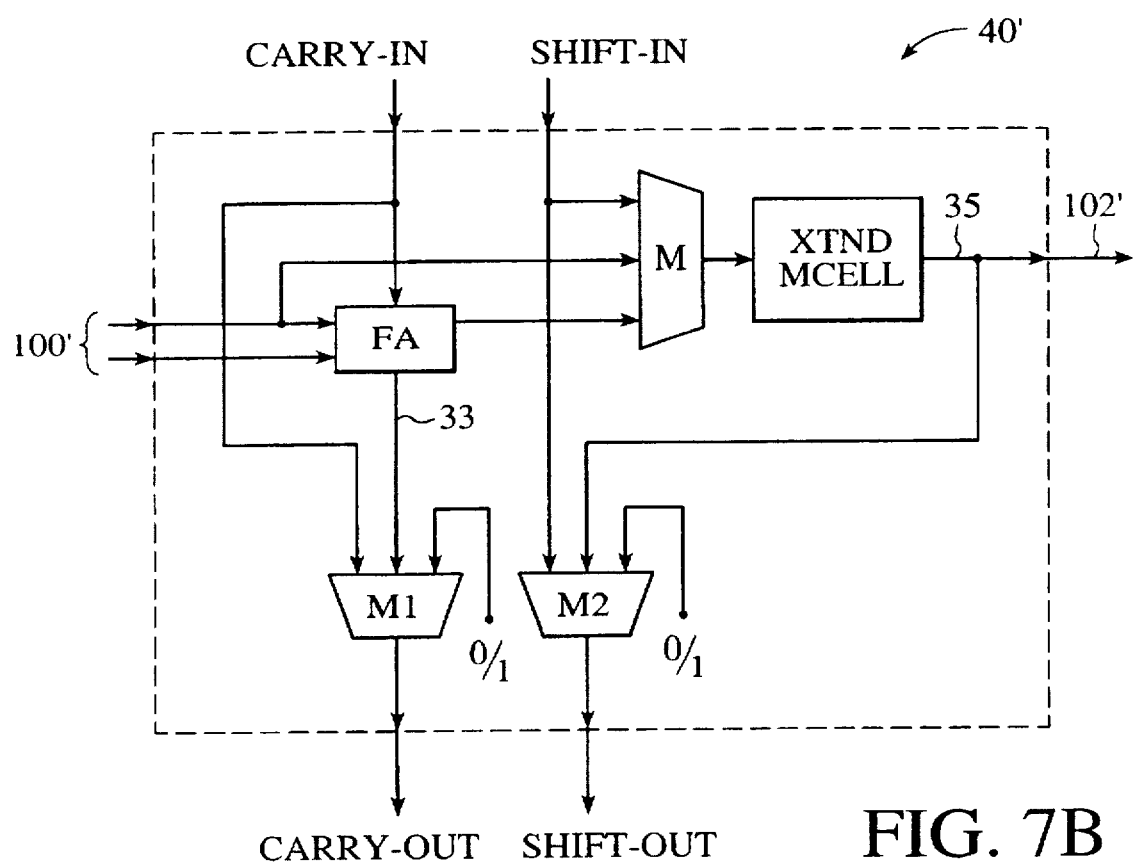

The multiplexers M1, M2 each may include a programmable element, shown in the figure as "0/1". This allows a carry chain or a shift chain to be initialized with a logic ONE or a logic ZERO. FIG. 7B shows the incorporation of the mux's M1, M2 into a typical logic cell such as the one shown in FIG. 6B. It is noted that the specific implementation of the logic circuitry 32 is not critical to the invention and can be any one of a number of designs.

An alternate embodiment of the logic cell of the present invention includes auxiliary carry lines, auxiliary shift lines, and additional circuitry to provide bi-directional carry and bi-directional shift chains. In a shift register application, for example, shifting can occur in descending order, from the most significant bit (MSB) position to the least significant bit (LSB) position, or alternatively in ascending order, from the LSB position to the MSB position. In an M-bit adder circuit the adder can be configured so that bit significance increases from bit 0 to bit M, or from bit M to bit 0.

Figure 8A:
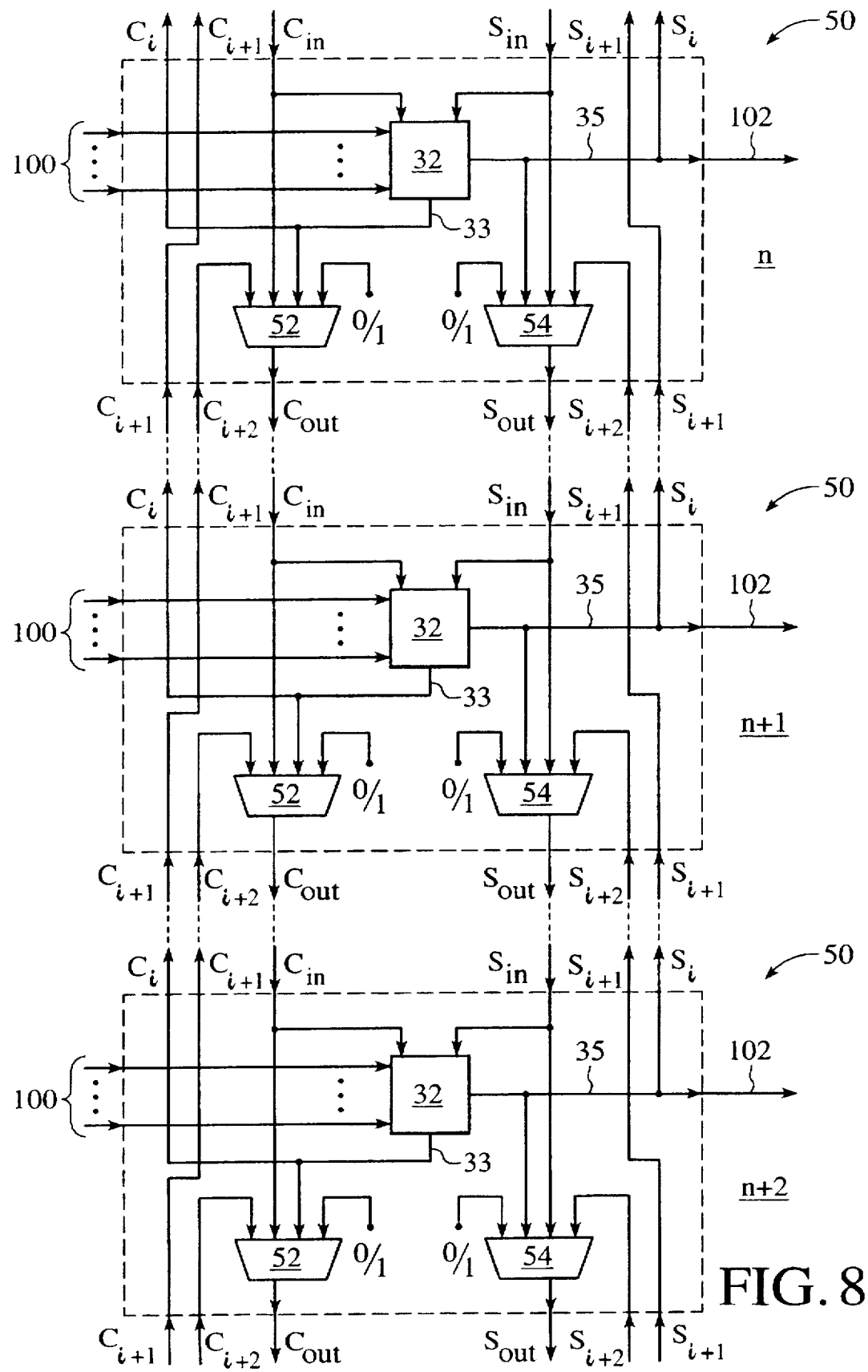
FIGS. 8A–8C show a reverse propagation means of the present invention.

In FIG. 8A, the logic cells 50 are shown with the conventional propagation lines, namely the carry-in line and carry-out lines $C_{in}$, $C_{out}$ and the shift-in and shift-out lines $S_{in}$, $S_{out}$. Each logic cell 50 is also shown having a set of auxiliary (or reverse) carry lines, namely a pair of incoming auxiliary carry lines $C_{i+1}$, $C_{i+2}$ and a pair of outgoing auxiliary carry lines $C_i$, $C_{i+1}$. A similar set of auxiliary (or reverse) shift lines is provided for the shift bit, namely a pair of incoming auxiliary shift lines $S_{i+1}$, $S_{i+2}$ and a pair of outgoing auxiliary shift lines $S_i$, $S_{i+1}$. These auxiliary lines participate in the reverse flow of the propagation bits. This feature is indicated in FIG. 8A by the reverse direction of the arrows for the auxiliary lines. Finally, each logic cell 50 further includes a carry mux 52 and a shift mux 54.

Both the carry-in bit line $C_{in}$ and the incoming auxiliary carry line $C_{i+2}$ are coupled as inputs to the carry mux 52. The carry bit 33 serves as another mux input and also serves as the outgoing auxiliary carry line $C_i$. The output of the carry mux 52 is coupled to the carry-out bit line $C_{out}$. The incoming auxiliary carry line $C_{i+1}$ is simply coupled to the outgoing auxiliary carry line $C_{i+1}$. The auxiliary shift lines are configured in a similar manner. Both the shift-in bit line $S_{in}$ and the incoming auxiliary shift line $S_{i+2}$ are coupled as inputs to the shift mux 54. The output 35 of the logic circuitry 32 serves as another mux input and is also coupled to the outgoing auxiliary shift line $S_i$. The incoming auxiliary shift line $S_{i+1}$ is simply coupled to the outgoing auxiliary shift line $S_{i+1}$.

As shown in FIG. 8A, the carry-out $C_{out}$ of a first logic cell (the n cell) is coupled to the carry-in $C_{in}$ of a second logic cell (the (n+1) cell), and similarly the shift-out $S_{out}$ of the n cell is coupled to the shift-in $S_{in}$ of the (n+1) cell.

Consequently, the propagation of bits proceeds from the n cell to the (n+1) cell, onward to the (n+2) cell, and so on. In this respect, the n cell is said to be "sequentially adjacent" the (n+1) cell. Stated another way, the n cell is followed by the (n+1) cell because the propagation bits produced by the n cell propagate into the (n+1) cell. Stated yet another way, the (n+1) cell is the next cell after the n cell. Thus with reference to FIG. 8A, the n cell is "sequentially adjacent" (or is followed by, or is next to) the (n+1) cell, and the (n+1) cell is "sequentially adjacent" the (n+2) cell. Note that the (n+1) cell is not "sequentially adjacent" the n cell, since the carry-out and shift-out bit lines of the (n+1) cell are not coupled to the corresponding carry-in and shift-in bit lines of the n cell. Sequential adjacency, therefore, is not a commutative relation.

Referring once more to FIG. 8A, turn now to the interconnections of the auxiliary lines between logic cells, shown in the figures by dashed lines. Consider the (n+1) and n cells. The outgoing auxiliary carry line $C_i$ of the (n+1) cell is coupled to the incoming auxiliary carry line $C_{i+1}$ of the n cell. The outgoing line $C_{i+1}$ of the (n+1) cell is coupled to the incoming line $C_{i+2}$ of the n cell. Since the outgoing line $C_{i+1}$ of the (n+1) cell is simply the outgoing carry line $C_i$ of its sequentially adjacent (n+2) cell, the $C_{i+2}$ line of the n cell is coupled to the outgoing $C_i$ line of a cell that is two away from the n cell.

The auxiliary shift lines are similarly coupled. Consider again the (n+1) and n cells of FIG. 8A. The outgoing auxiliary shift line $S_i$ of the (n+1) cell is coupled to the incoming auxiliary shift line $S_{i+1}$ of the n cell. The outgoing auxiliary shift line $S_{i+1}$ of the (n+1) cell is coupled to the incoming $S_{i+2}$ line of the n cell, which is simply the outgoing line $S_i$ of its sequentially adjacent (n+2) cell. The $S_{i+2}$ line of the n cell therefore is coupled to the outgoing $S_i$ line of a cell that is two away from the n cell.

From the above description, it can be observed that the subscript of the label of each auxiliary line indicates the source of the data bits carried by that line. Consider, for example, the auxiliary carry lines of the n cell. The incoming carry line $C_{i+1}$ carries incoming data which originates from a cell that is one away from the n cell in the downstream direction, namely the (n+1) cell. The incoming carry line $C_{i+2}$ carries incoming data which originates from a cell that is two away from the n cell in the downstream direction, namely the (n+2) cell. On the outgoing side of the n cell, the outgoing carry line $C_i$ carries outgoing data originating from the n cell itself, and the outgoing carry line $C_{i+1}$ carries outgoing data originating from a cell one away from the n cell, namely the (n+1) cell, and so on. The shift lines are treated in identical fashion.

Figure 8B:
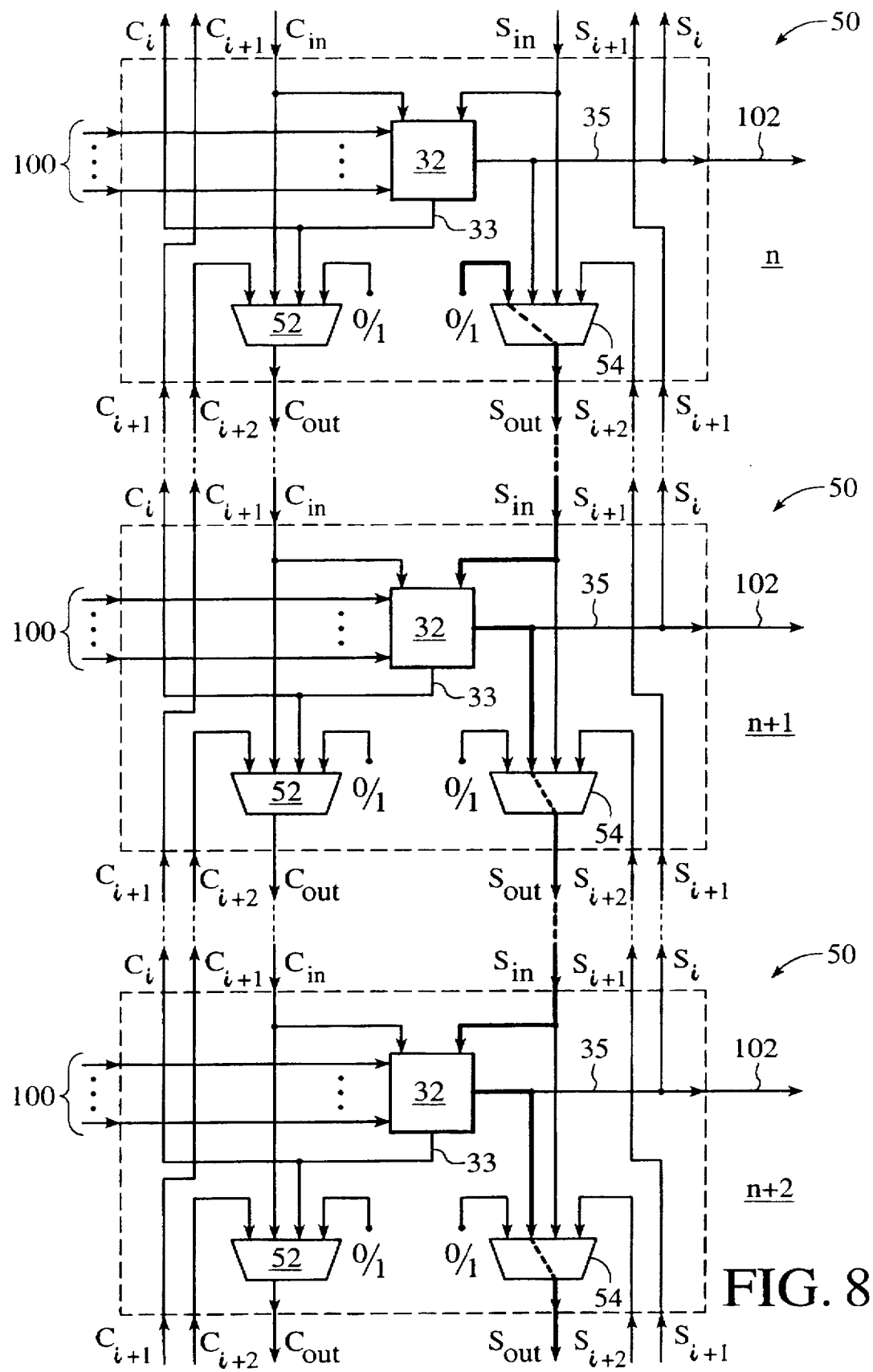

Operation of the logic cells 50 shown in FIG. 8A will now be described. First, with reference to FIGS. 8A and 8B, operation of the cells during a forward propagation of the shift bits will be explained. Assume that a single bit is to be shifted from the n cell to the (n+2) cell. The n cell is programmed to provide a logic "0" or "1" by programming the programmable element coupled to the shift mux 54. The shift mux is selected to transfer the programmed bit to the shift-out bit line $S_{out}$ of the n cell, as shown in FIG. 8B. The sequentially adjacent (n+1) cell receives the bit on its shift-in bit line $S_{in}$. The (n+1) cell (specifically, its logic circuitry 32) is programmed to function as a flip-flop for receiving and holding the incoming bit. The shift mux 54 of the (n+1) cell is programmed to select its logic output 35 as indicated by the dashed line in mux 54. Thus, in a subsequent clock cycle, the bit leaves the (n+1) cell via its shift-out bit line $S_{out}$ which is coupled to the shift-in bit line $S_{in}$ of the (n+2) cell, and is stored in the (n+2) cell. In this way, the bit which originated in the n cell is shifted to sequentially adjacent cells; first the (n+1) cell, then the (n+2) cell, and so on. Note that the embodiments shown use non-latching multiplexers. These are appropriate where the cycle time is sufficiently long to allow the multiplexers to effectuate a transfer of the desired input to the mux output. However, in certain applications the use of latching multiplexers may be more appropriate. The present invention is not limited to the use of a particular kind of multiplexer, and will work equally well with latching mux's.

A bypass during a forward shift will now be explained. Referring again to FIG. 8B and starting from the n cell, assume that the (n+1) cell is to be bypassed. This is achieved by programming the shift mux 54 of the (n+1) cell to transfer its $S_{in}$ line to its $S_{out}$ line (not shown). When the n cell shifts the bit into the (n+1) cell, the mux 54 of the (n+1) cell will pass the incoming bit directly to $S_{out}$, thus bypassing the (n+1) cell and continuing on to the (n+2) cell.

Figure 8C:
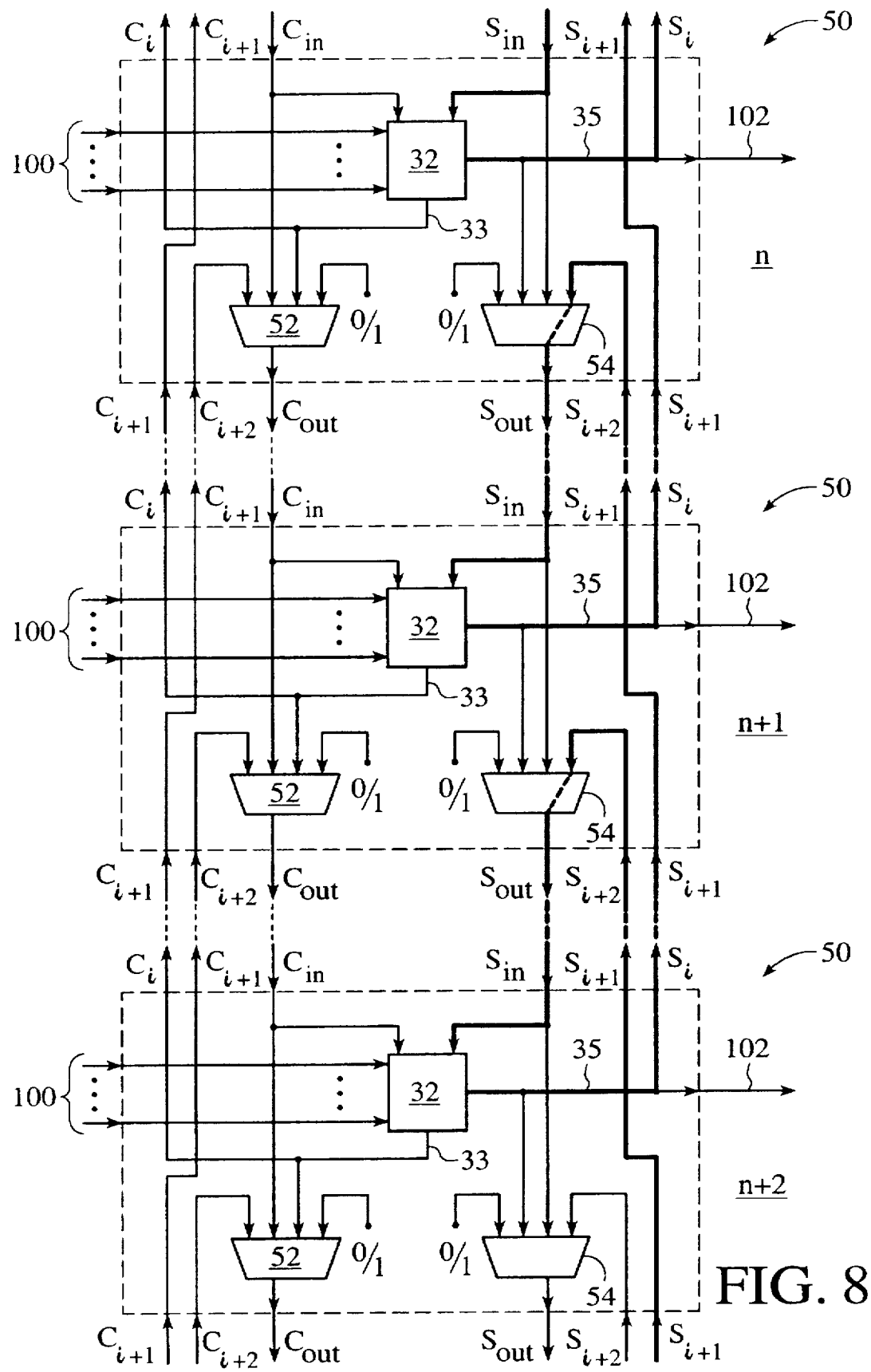

Next, operation of the logic cells 50 during a reverse shift operation will be described with reference to FIGS. 8A and 8C. Assume that the logic circuitry 32 in each of the cells, n, (n+1), and (n+2), has been programmed to act as a flip-flop. Assume further that a bit appears on the incoming shift line $S_{i+1}$ of the (n+2) cell. As shown in FIG. 8C, the incoming bit passes through the (n+2) cell and exits via the outgoing shift line $S_{i+1}$. The bit enters the (n+1) cell via its incoming $S_{i+2}$ shift line and immediately exits the (n+1) cell through the shift mux 54 and the shift-out bit line $S_{out}$. The bit re-enters the (n+2) cell and is stored in logic circuitry 32. When the bit stored in the (n+2) cell is shifted out onto the logic circuitry output 35, the bit will exit the cell through its outgoing auxiliary shift line $S_i$. The bit enters the (n+1) cell through its incoming auxiliary shift line $S_{i+1}$. From there, it simply passes through the (n+1) cell and exits at its outgoing shift line $S_{i+1}$. The bit enters the n cell through its incoming shift line $S_{i+2}$ immediately exits the n cell via the shift mux 54 and the shift-out bit line $S_{out}$, re-enters the (n+1) cell through its shift-in bit line $S_{in}$, and is stored in the logic circuitry 32 of the (n+1) cell. Thus, the bit which entered the (n+2) cell has been reverse shifted to the (n+1) cell. FIG. 8C shows in highlight the flow path of the bit.

During a subsequent clock cycle, the bit leaves the (n+1) cell through its outgoing auxiliary shift line $S_i$ and once again enters the n cell through the incoming shift line $S_{i+1}$. This time, however, the bit passes through the n cell, exiting the n cell at its outgoing shift line $S_i$, and enters an (n−1) cell (not shown) through the incoming shift line $S_{i+2}$ of the (n−1) cell. As in the other logic cells, the shift mux 54 of the (n−1) cell is programmed to select the $S_{i+2}$ shift line, so that the bit immediately exits the (n−1) cell via the shift mux, re-enters the n cell (via $S_{in}$), and is stored in the n cell. The bit has been reverse shifted once again, this time from the (n+1) cell to the n cell.

Thus, by properly programming the shift mux's 54 of the logic cells 50, a forward shift (FIG. 8B) or a reverse shift (FIG. 8C) operation is possible. Forward and reverse propagation of carry bits in an adder circuit can be effected in a similar manner by properly programming the carry mux's 52 of the logic cells comprising the adder circuit.

Figure 9A:
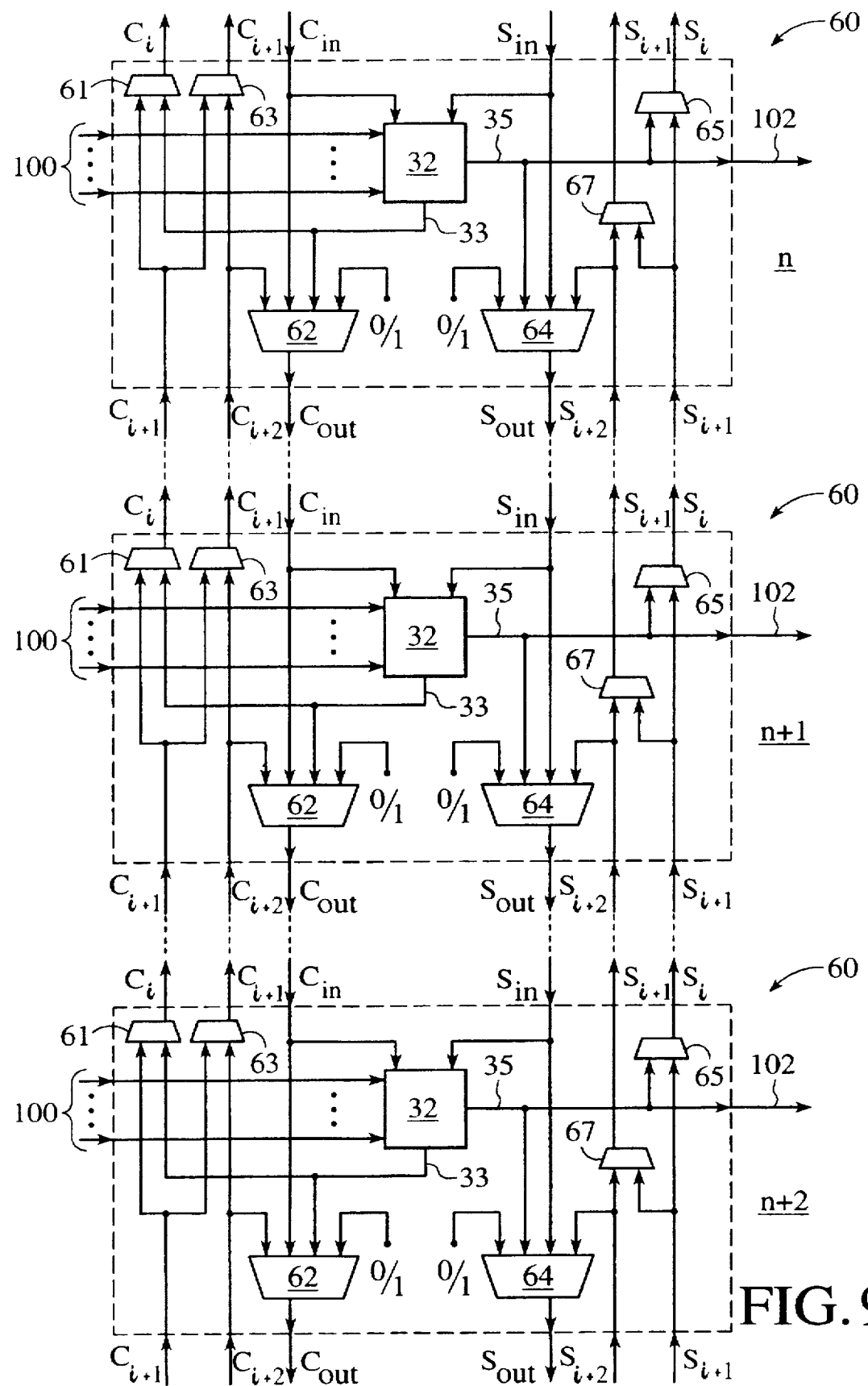
FIGS. 9A–9C show a reverse propagation means with bypass capability.

The discussion will now turn to another embodiment of the logic cells of the present invention. The logic cells 60 shown in FIG. 9A are a variation of the cells shown in FIG. 8A. The logic cells 60 possess the same auxiliary carry and auxiliary shift lines as shown in FIG. 8A, and include the same carry mux 62 and shift mux 64 as shown in FIG. 8A.

The cells of FIG. 9A, therefore, operate in the same fashion during forward propagation, with and without bypass, and during reverse propagation without bypass, as explained with reference to FIGS. 8A–8C.

The cells in FIG. 9A further include additional logic to provide a reverse bypass means, allowing for logic cells to be bypassed during reverse propagation. Each cell 60 in FIG. 9A includes a first reverse direction mux 61, the output of which is coupled to the outgoing auxiliary carry line $C_i$. The inputs to the reverse mux 61 include the carry bit 33 of the logic circuitry 32 and the incoming auxiliary carry line $C_{i+1}$. A second reverse direction mux 63 provides an output to the outgoing auxiliary carry line $C_{i+1}$. The inputs to the second reverse mux 63 include both of the incoming auxiliary carry lines $C_{i+1}$, $C_{i+2}$. A third reverse direction mux 65 provides an output to the outgoing auxiliary shift line $S_i$. The inputs to the third reverse mux 65 include the logic circuitry output 35 and the incoming auxiliary shift line $S_{i+1}$. A fourth reverse direction mux 67 provides an output to the outgoing auxiliary shift line $S_{i+1}$. The inputs to the fourth reverse mux 67 include both of the incoming auxiliary shift lines $S_{i+1}$, $S_{i+2}$.

Figure 9B:
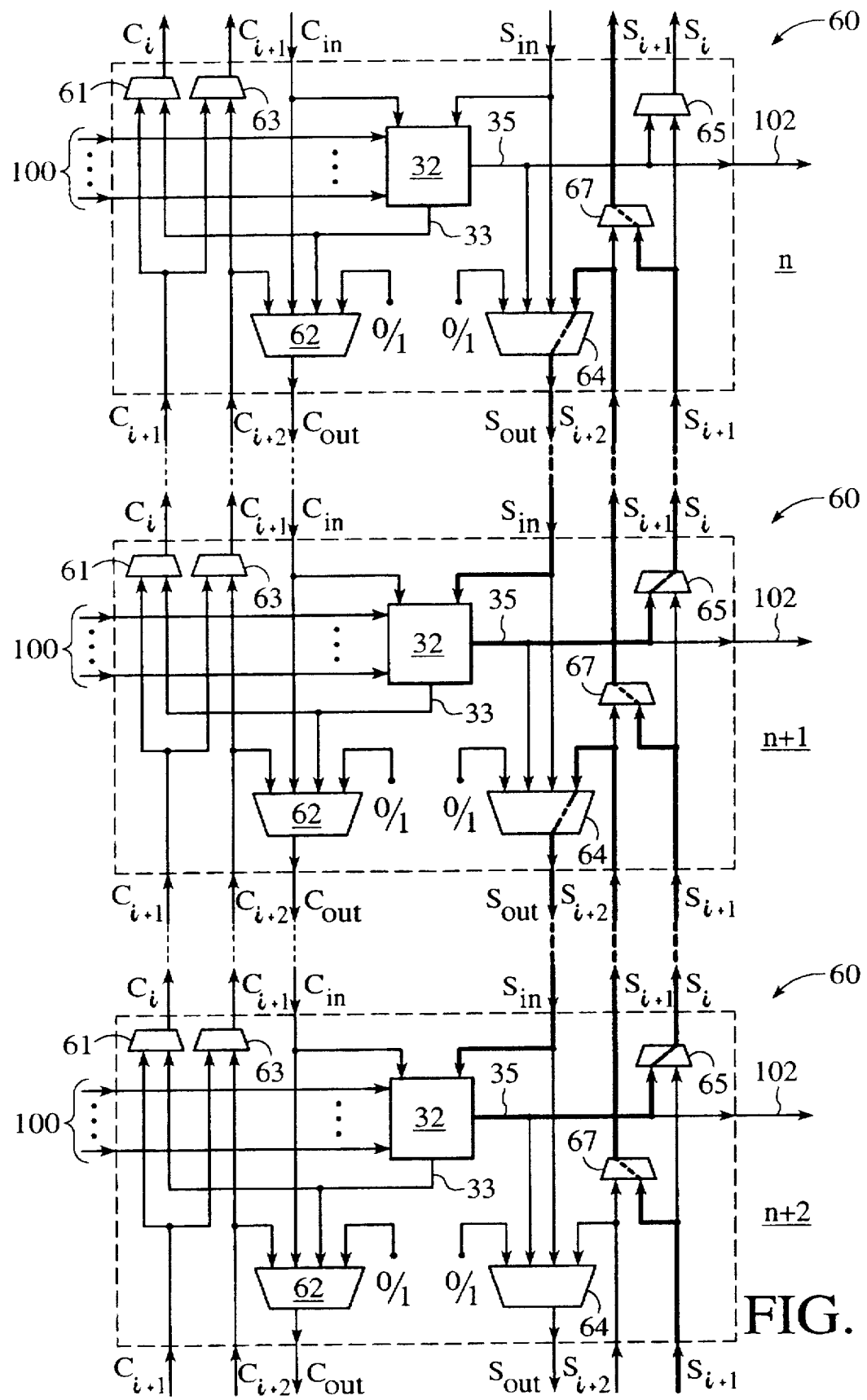

Operation of the logic cells 60 of FIG. 9A will now be described, first with respect to a reverse propagation operation without bypass as shown by the highlighted flow path illustrated in FIG. 9B. Assume that the logic circuitry 32 of the logic cells have been programmed as flip-flop elements. Assume that a bit appears on the incoming shift line $S_{i+1}$ of the (n+2) cell. The fourth reverse mux 67 of the (n+2) cell is selected to output the incoming bit to the outgoing shift line $S_{i+1}$. The bit enters the (n+1) cell on its $S_{i+2}$ shift line. In the (n+1) cell, the shift mux 64 is programmed to select the $S_{i+2}$ line so that the incoming bit immediately exits the (n+1) cell via the shift mux and the $S_{out}$ line. The bit re-enters the (n+2) cell and is stored in the logic circuitry 32. When the bit is shifted out onto the logic circuitry output 35 of the (n+2) cell, it enters the third reverse mux 65, which has been programmed to send the logic output 35 through the outgoing $S_i$ shift line. The bit once again enters the (n+1) cell, this time through $S_{i+1}$ which has been selected by the fourth reverse mux 67. As shown in FIG. 9B, the bit simply passes through the (n+1) cell, exiting via the $S_{i+1}$ line, and enters the n cell through $S_{i+2}$. The bit immediately exits the n cell through the shift mux 64, re-enters the (n+1) cell, and is stored in the (n+1) cell. Thus, the bit which entered the (n+2) cell has been reverse propagated to the (n+1) cell. As can be seen, by programming the third and fourth reverse mux's 65, 67 as explained above and shown in FIG. 9B, the reverse propagation flow is essentially the same flow shown in FIG. 8C.

Figure 9C:
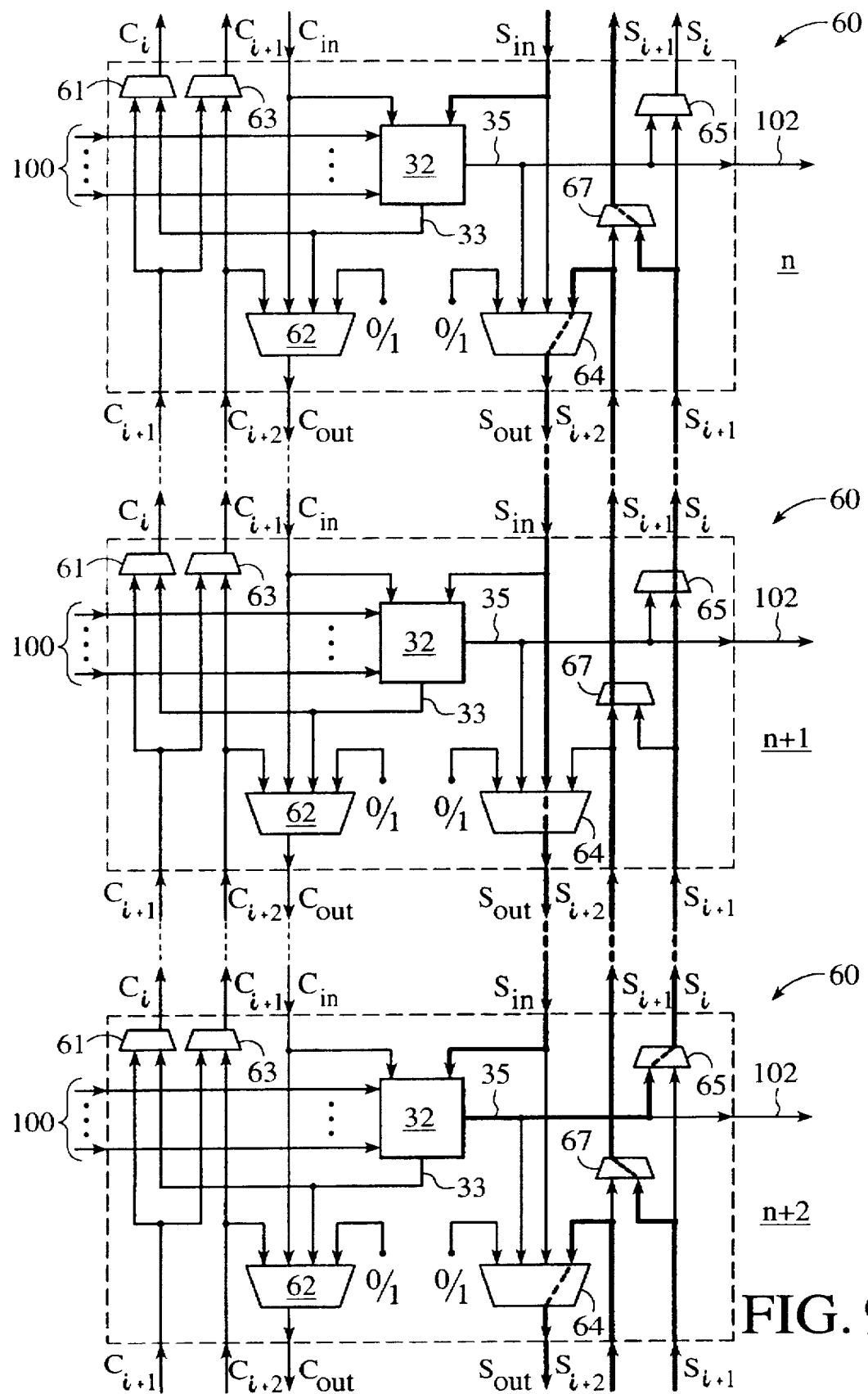

Refer now to FIG. 9C for a description of a reverse flow with bypass. Again, assume a bit appears on the incoming shift line $S_{i+1}$ of the (n+2) cell. This time, however, assume that the (n+1) cell is to be bypassed. As before, the fourth reverse mux 67 of the (n+2) cell is selected to output the incoming bit at incoming shift line $S_{i+1}$ to the outgoing shift line $S_{i+1}$. The bit enters the (n+1) cell on its $S_{i+2}$ shift line. The fourth reverse mux 67 of the (n+1) cell is selected to transfer its incoming shift line $S_{i+2}$ to its outgoing shift line $S_{i+1}$. This causes the incoming bit to bypass the (n+1) cell and proceed to the incoming shift line $S_{i+2}$ of the n cell. From the n cell, the bit is turned back via the shift mux 64 of the n cell, causing the bit to re-enter the (n+1) cell. The shift mux 64 of the (n+1) cell is programmed to select the shift-in bit line $S_{in}$, so that the returning bit once again bypasses the (n+1) cell and enters the (n+2) cell instead, finally to be stored in the logic circuitry of the (n+2) cell.

Continuing, the bit stored in the (n+2) cell next is shifted onto the logic output 35 which has been selected by the third reverse mux 65. The bit proceeds into the (n+1) cell and once again bypasses the (n+1) cell by virtue of the programming of the reverse mux 65 of the (n+1) cell. The bit enters the n cell at its incoming shift line $S_{i+1}$, is directed to its outgoing shift line $S_{i+1}$ by its reverse mux 67, and enters a preceding (n–1) cell (not shown) through an incoming shift line $S_{i+2}$ of the (n–1) cell. From the (n–1) cell, the bit is turned around via its shift mux 64, re-enters the n cell, and is stored in the n cell. Thus, the bit has been reverse shifted from the (n+2) cell into the n cell, bypassing the (n+1) cell.

I claim:

1. A programmable logic device comprising:

a plurality of logic blocks, each logic block having inputs and outputs, said outputs carrying signals that are logical functions of said inputs, each logic block including a propagate-in bit line, a propagate-out bit line, and a corresponding bypass circuit; said each logic block further having an outgoing propagation line for coupling to a sequentially adjacent logic block; said bypass circuit having a bypass output and first and second bypass inputs; said propagate-in and propagate-out bit lines respectively coupled to said first and second bypass inputs; said outgoing propagation line coupled to said bypass output; said bypass circuit further having a selector for transferring one of said first and second bypass inputs to said bypass output; whereby a logic block is bypassed by transferring said first bypass input to said bypass output; and a partially populated switch matrix having fewer than $(B^2 * P * R)$ programmable switches for interconnecting said outputs of said logic blocks to said inputs of said logic blocks, B being the number of said logic blocks, P being the number of said inputs in each of said logic blocks, R being the number of said outputs in each of said logic blocks.

2. The programmable logic device of claim 1 wherein said bypass circuit is a 2:1 multiplexer.

3. The programmable logic device of claim 1 wherein said propagate-in and propagate-out bit lines are either carry-in and carry-out bit lines respectively, or shift-in and shift-out bit lines respectively.

4. The programmable logic device of claim 1 wherein said bypass circuit includes a third input, being coupled to a programmable element so as to provide a logical "0" or a logical "1".

5. A programmable logic device comprising:

a plurality of configurable logic blocks, each logic block having a plurality of inputs, a plurality of outputs, a carry-in bit line, and a carry-out bit line;

a switch matrix having a first set of M conductive leads each coupled to an input of a logic block, and a second set of N conductive leads each coupled to an output of a logic block, said switch matrix further having programmable interconnections between leads of said first set and leads of said second set, the number of said programmable interconnections being less than the product M*N; and a plurality of first programmable bypass means each for selectively coupling either a carry-out bit line of a first logic block or a carry-out bit line of a second logic block to a carry-in bit line of a third logic block.

6. The programmable logic device of claim 5 wherein each logic block further includes a shift-in bit line and a shift-out bit line, the programmable logic device further including a plurality of second programmable bypass means, each for selectively coupling a shift-out bit line from one of two logic blocks to a shift-in bit line of a third logic block.

7. The programmable logic device of claim 5 wherein each programmable bypass means includes a 2:1 mux for selecting between said carry-out bit lines of said first and second logic blocks.

8. The programmable logic device of claim 5 wherein each programmable bypass means includes a 3:1 mux for selecting between said carry-out bit line of said first logic block and said carry-out bit line of said second logic block, and an output of a programmable bit to provide a logic "1" or "0".

9. The programmable logic device of claim 5 wherein each logic block includes a plurality of logic cells; each logic cell having configurable logic circuitry, a shift-in bit line, and a shift-out bit line, said logic circuitry having a logic output; each logic cell further having a first bypass means for selectively transferring one of said shift-in bit line and said logic output to said shift-out bit line.

10. The programmable logic device of claim 9 wherein each logic cell further includes a carry-in bit line and a carry-out bit line; said logic circuitry further having a carry output; each logic cell further including a second bypass means for selectively transferring one of said carry-in bit line and said carry output to said carry-out bit line.

11. In a programmable logic device having a plurality of logic blocks and a switch matrix, each logic block having block-level inputs and block-level outputs, each logic block further having a plurality of logic cells having logic outputs coupled to block-level outputs of said each logic block, said plurality of logic cells including a first logic cell sequentially adjacent a second logic cell, said second logic cell sequentially adjacent a third logic cell, each of said logic cells having logic circuitry configurable for a plurality of logic functions, said logic circuitry capable of generating a carry bit, each logic cell further having a carry-in bit line, a carry-out bit line, a shift-in bit line, and a shift-out bit line, the improvement comprising:

a carry selector disposed in said first logic cell, said carry selector having first, second, and third inputs, and further having an output coupled to a carry-out bit line of said first logic cell;

said first carry selector input coupled to a carry-in bit line of said first logic cell;

said second carry selector input coupled to receive a carry bit from logic circuitry of said first logic cell;

said third carry selector input coupled to receive said carry bit from said logic circuitry of said third logic cell;

whereby a reverse propagation path for a carry bit from said third logic cell into said second logic cell is created by programming said carry selector of said first logic cell to select said third carry selector input.

12. The programmable logic device of claim 11 wherein said carry selector includes a fourth input coupled to a programmable element, to provide a logic "1" or logic "0" at said fourth input.

13. The programmable logic device of claim further including:

a shift selector disposed in said first logic cell, said shift selector having first, second, and third inputs, and further having an output coupled to a shift-out bit line of said first logic cell;

said first shift selector input coupled to a shift-in bit line of said first logic cell;

said second shift selector input coupled to logic circuitry output of said first logic cell;

said third shift selector input coupled logic circuitry output of said third logic cell;

whereby a reverse shift of a bit stored in said third logic cell to said second logic cell is achieved by programming said shift selector of said first logic cell to select said third shift selector input.

14. The programmable logic device of claim 13 wherein said shift selector includes a fourth input coupled to a programmable element, to provide a logic "1" or logic "0" at said fourth input.

15. The programmable logic device of claim 11 wherein said switch matrix is partially populated so that any one of said block-level outputs of said logic blocks can be coupled to at most a subset of said block-level inputs of said logic blocks.

16. The programmable logic device of claim 15 wherein each logic block includes:

a block-level carry-in bit line, a block-level carry-out bit line, and an outgoing carry line for coupling said block-level carry-out bit line to a block-level carry-in bit line of a succeeding logic block;

a first block-level select means for transferring said block-level carry-in bit line or said block-level carry-out bit line to said outgoing carry line;

a block-level shift-in bit line, a block-level shift-out bit line, and an outgoing shift line for coupling said block-level shift-out bit line to a block-level shift-in bit line of a succeeding logic block; and a second block-level select means for transferring said block-level shift-in bit line or said block-level shift-out bit line to said outgoing shift line.

17. In a programmable logic device having a plurality of logic blocks and a switch matrix, each logic block having block-level inputs and block-level outputs, each logic block further having a plurality of logic cells having logic outputs coupled to said block-level outputs of said each logic block, each of said logic cells having logic circuitry configurable for a plurality of logic functions, said logic circuitry capable of generating a carry bit, each logic cell further having a forward carry-in bit line, a forward carry-out bit line, a forward shift-in bit line, and a forward shift-out bit line, the improvement in each logic cell comprising:

first and second reverse carry-in bit lines;

first and second reverse carry-out bit lines;

a programmable carry selector having a first input coupled to said second reverse carry-in bit line, a second input coupled to said forward carry-in bit line, a third input coupled to receive a carry bit generated by said logic circuitry, and an output coupled to said forward carry-out bit line;

a first reverse propagation means for transferring either said first reverse carry-in bit line or said carry bit to said first reverse carry-out bit line; and a second reverse propagation means for transferring either of said first and second reverse carry-in bit lines to said second reverse carry-out bit line.

18. The programmable logic device of claim 17 wherein said first reverse propagation means is a 2:1 multiplexer.

19. The programmable logic device of claim 18 wherein said second reverse propagation means is a second 2:1 multiplexer.

20. The programmable logic device of claim 17 wherein said each logic cell further includes:

first and second reverse shift-in bit lines;

first and second reverse shift-out bit lines;

a programmable shift selector having a first input coupled to said logic circuitry output, a second input coupled to said forward shift-in bit line, a third input coupled to said first reverse shift-in bit line, and an output coupled to said forward shift-out bit line;

a third reverse propagation means for transferring either of said first and second reverse shift-in bit lines to said first reverse shift-out bit line; and a fourth reverse propagation means for transferring either said second reverse shift-in bit line or said logic circuitry output to said second reverse shift-out bit line.

21. The programmable logic device of claim 20 wherein said third reverse propagation means is a 2:1 multiplexer.

22. The programmable logic device of claim 21 wherein said fourth reverse propagation means is a 2:1 multiplexer.

23. The programmable logic device of claim 22 wherein said switch matrix is partially populated so that any one of said block-level outputs of said logic blocks can be coupled to at most a subset of said block-level inputs of said logic blocks.

24. The programmable logic device of claim 23 wherein each logic block includes:

- a block-level carry-in bit line, a block-level carry-out bit line, and an outgoing carry line for coupling said block-level carry-out bit line to a block-level carry-in bit line of a succeeding logic block;
- a first block-level select means for transferring said block-level carry-in bit line or said block-level carry-out bit line to said outgoing carry line;
- a block-level shift-in bit line, a block-level shift-out bit line, and an outgoing shift line for coupling said block-level shift-out bit line to a block-level shift-in bit line of a succeeding logic block; and
- a second block-level select means for transferring said block-level shift-in bit line or said block-level shift-out bit line to said outgoing shift line.

25. A programmable logic device comprising:

a plurality of logic blocks, each logic block having inputs and outputs, said outputs carrying signals that are logical functions of said inputs; each logic block including a plurality of programmable logic cells, inputs to said logic cells being logical functions of inputs of said logic block, outputs of said logic block being outputs of said logic cells, each logic cell including a carry-in bit line, a carry-out bit line, and a corresponding programmable bypass means for transferring said carry-in bit line to said carry-out bit line so as to bypass said logic cell; and a partially populated switch matrix having fewer than $(B^2*P*R)$ programmable switches for interconnection said outputs of said logic blocks to said inputs of said logic blocks, B being the number of said logic blocks, P being the number of said inputs in each of said logic blocks, R being the number of said outputs in each of said logic blocks.

26. The programmable logic device of claim 25 wherein said programmable bypass means comprises a multiplexer having at least two inputs, a first input being coupled to said carry-in bit line and a second input being coupled to an output of said generator means, said multiplexer further having an output coupled to said carry-out bit line.

27. The programmable logic device of claim 25 wherein each logic cell includes a shift-in bit line and a shift-out bit line, and a corresponding programmable bypass means for transferring said shift-in bit line to said shift-out bit line so as to bypass said logic cell.

28. The programmable logic device of claim 27 wherein said each logic cell further includes means for generating a carry bit, and wherein said programmable bypass means comprises a multiplexer having at least two inputs, a first input being coupled to said shift-in bit line and second input being coupled to an output of said logic cell, said multiplexer further having an output coupled to said shift-out bit line.

* * * * *